(12) United States Patent
Xu et al.

(10) Patent No.: US 11,290,063 B2
(45) Date of Patent: Mar. 29, 2022

(54) LOW NOISE AMPLIFIER

(71) Applicant: Montage LZ Technologies (Chengdu) Co., Ltd., Chengdu (CN)

(72) Inventors: Jun Xu, Chengdu (CN); Xinwu Cai, Chengdu (CN); Shunfang Wu, Chengdu (CN); Shen Feng, Chengdu (CN); Mingfu Shi, Chengdu (CN); Taibo Dong, Chengdu (CN)

(73) Assignee: Montage LZ Technologies (Chengdu) Co., Ltd., Chengdu (CN)

( * ) Notice: Subject to any disclaimer, the term of this patent is extended or adjusted under 35 U.S.C. 154(b) by 22 days.

(21) Appl. No.: 15/931,595

(22) Filed: May 14, 2020

(65) Prior Publication Data

US 2021/0203281 A1 Jul. 1, 2021

(30) Foreign Application Priority Data

Dec. 30, 2019 (CN) .......................... 201911389432.5

(51) Int. Cl.
*H03F 3/26* (2006.01)
*H03F 1/26* (2006.01)
*H03F 3/45* (2006.01)

(52) U.S. Cl.
CPC ........... *H03F 1/26* (2013.01); *H03F 3/45076* (2013.01); *H03F 2200/294* (2013.01); *H03F 2200/372* (2013.01); *H03F 2203/45704* (2013.01)

(58) Field of Classification Search
CPC .................. H03F 1/26; H03F 3/45076; H03F 2203/45704; H03F 2200/294; H03F 2200/372; H03F 3/211; H03F 3/45183; H03F 2200/451; H03F 3/195; H03F 3/45475
USPC .............................. 330/295, 124 R, 252, 254
See application file for complete search history.

(56) References Cited

U.S. PATENT DOCUMENTS 6,072,366 A * 6/2000 Maeda ............... H04B 10/6931
250/214 A
9,054,648 B1 6/2015 Xu

OTHER PUBLICATIONS

Donggu Im, et al., "A CMOS Active Feedback Balun-LNA With High IIP2 for Wideband Digital TV Receivers", IEEE Transactions on Microwave Theory and Techniques, vol. 58, No. 12, Dec. 2010, pp. 3566-3579.

(Continued)

*Primary Examiner* — Khanh V Nguyen
*Assistant Examiner* — Khiem D Nguyen
(74) *Attorney, Agent, or Firm* — JCIP Global Inc.

(57) ABSTRACT

A low noise amplifier includes a preamplifier, first differential amplifiers, second differential amplifiers, a signal adder, and a load circuit. The preamplifier receives an input signal, and amplifies the input signal to generate a first signal. The input signal and the first signal have the same phase. The first differential amplifiers receive the first signal and a first reference signal and generate a first output differential signal pair. The second differential amplifiers receive the input signal and a second reference signal and generate a second output differential signal pair. The signal adder adds up the first output differential signal pair and the second output differential signal pair. The load circuit is coupled to the signal adder, and generates a third output differential signal pair according to the addition result.

12 Claims, 3 Drawing Sheets

(56) References Cited

OTHER PUBLICATIONS

Stephan C.Blaakmeer, et al., "Wideband Balun-LNA With Simultaneous Output Balancing, Noise-Canceling and Distortion-Canceling", IEEE Journal of Solid-State Circuits, vol. 43, No. 6, Jun. 2008, pp. 1341-1350.

* cited by examiner

LOW NOISE AMPLIFIER

CROSS-REFERENCE TO RELATED APPLICATION

This application claims the priority benefit of China application serial no. 201911389432.5, filed on Dec. 30, 2019. The entirety of the above-mentioned patent application is hereby incorporated by reference herein and made a part of this specification.

BACKGROUND OF THE INVENTION

1. Field of the Invention

The present application relates to a low noise amplifier, and particularly relates to a wideband low noise amplifier with single-to-differential conversion.

2. Description of Related Art

In the conventional art, a common source amplifier and a balun are commonly adopted in a low noise amplifier to realize single-to-differential conversion and low noise amplification at the same time. The common source amplifier is configured to process a single-ended signal. However, the performance of gain, impedance matching and noise figure provided by the common source amplifier are very sensitive to bonding condition of a chip, whereas bonding wire is an important component in a feedback structure of a conventional low noise amplifier. Besides, a common mode rejection ratio (CMRR) and a power supply rejection ratio (PSRR) of the conventional single-ended common source amplifier are worse and easily affected by noise on the power supply and the ground. Also, the feedback structure is commonly adopted in the conventional low noise amplifier to realize impedance matching. Such feedback structure requires a feedback path from an output end to an input end for wideband input impedance matching, so the low noise amplifier needs to provide a stable gain from the input end to the output end. Therefore, it is important to provide fixed load impedance at different working frequencies. For such reason, in the conventional wide band low noise amplifier, it is unacceptable to directly load an inductor-capacitor resonant tank (LC tank) or a passive mixer as a part of a feedback circuit. If an additional gain stage or amplifier is inserted between the low noise amplifier and a load whose impedance varies with frequency, extra power may be consumed and the linearity of signal may be limited.

SUMMARY OF THE INVENTION

The embodiments of the present application provide a low noise amplifier capable of realizing wideband matching and single-to-differential conversion simultaneously. With noise cancellation under a differential mode, the low noise amplifier exhibits favorable noise performance, and is capable of undertaking a load whose impedance varies with frequency within the working frequency band while exhibiting favorable linearity and power supply rejection ration (PSRR) at high frequencies.

According to an embodiment of the present application, a low noise amplifier includes a preamplifier, a plurality of first differential amplifiers, a plurality of second differential amplifiers, a signal adder, and a load circuit. The preamplifier receives an input signal, and amplifies the input signal to generate a first signal. The input signal and the first signal have the same phase. The first differential amplifiers are coupled to the preamplifier's output, receive the first signal and a first reference signal as a first input differential signal pair, and generate a first output differential signal pair according to the first input differential signal pair. The second differential amplifiers receive the input signal and a second reference signal as a second input differential signal pair, and generate a second output differential signal pair according to the second input differential signal pair. The signal adder is coupled to the first differential amplifiers and the second differential amplifiers and configured to add up the first output differential signal pair and the second output differential signal pair to generate an addition result. The load circuit is coupled to the signal adder, and generates a third output differential signal pair according to the addition result.

In the low noise amplifier according to an embodiment of the present application, each of the first differential amplifiers includes a differential pair and a current source. The differential pair has a first input end to receive the first signal and has a second input end to receive the first reference signal. The current source is coupled between a common end of the differential pair and a reference voltage end, and provides a reference current between the common end of the differential pair and the reference voltage end. The differential pair has a first output end configured to generate a first output signal and a second output end configured to generate a second output signal, and the first output signal and the second output signal form the first output differential signal pair.

In the low noise amplifier according to an embodiment of the present application, each of the first differential amplifiers further includes a capacitor. The capacitor is coupled between the second input end of the differential pair and the reference voltage end to exhibit a low impedance at the working frequency.

The low noise amplifier according to an embodiment of the present application further includes a DC decoupling capacitor. The DC decoupling capacitor is coupled between the preamplifier and the first input end of the differential pair.

In the low noise amplifier according to an embodiment of the present application, each of the second differential amplifiers includes a differential pair and a current source. The differential pair has a first input end to receive the input signal and has a second input end to receive the second reference signal. The current source is coupled between a common end of the differential pair and a reference voltage end, and provides a reference current between the common end of the differential pair and the reference voltage end. The differential pair has a first output end configured to generate a first output signal and a second output end configured to generate a second output signal, and the first output signal and the second output signal form the second output differential signal pair.

In the low noise amplifier according to an embodiment of the present application, the preamplifier is a common gate amplifier or a noninverting amplifier which is capable of providing input impedance matching.

In the low noise amplifier according to an embodiment of the present application, the preamplifier includes a load, a transistor, and a current source. The load has a first end connected to a power supply. The transistor has a first end coupled to a second end of the load, a control end coupled to a reference voltage end via a capacitor, and a second end receiving the input signal. The current source is coupled between the second end of the transistor and the reference voltage end.

In the low noise amplifier according to an embodiment of the present application, the current source in the preamplifier is formed by an inductor or a coil.

In the low noise amplifier according to an embodiment of the present application, the load circuit includes a first resistor, a second resistor, and an inductor-capacitor resonant tank. The first resistor is connected between the power source voltage and a first output end of the signal adder. The second resistor is connected between the power source voltage and a second output end of the signal adder. The inductor-capacitor resonant tank is coupled between the first output end and the second output end of the signal adder.

Based on the above, in the low noise amplifier of the present application, the first differential amplifiers and the second differential amplifiers for two paths are disposed. By adding up the first output differential signal and the second output differential signal generated by the first differential amplifiers and the second differential amplifiers respectively, the signal can be enhanced, and the noise generated by the preamplifier may be entirely or partially canceled. As a result, the signal to noise ratio is increased and the signal quality is improved.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
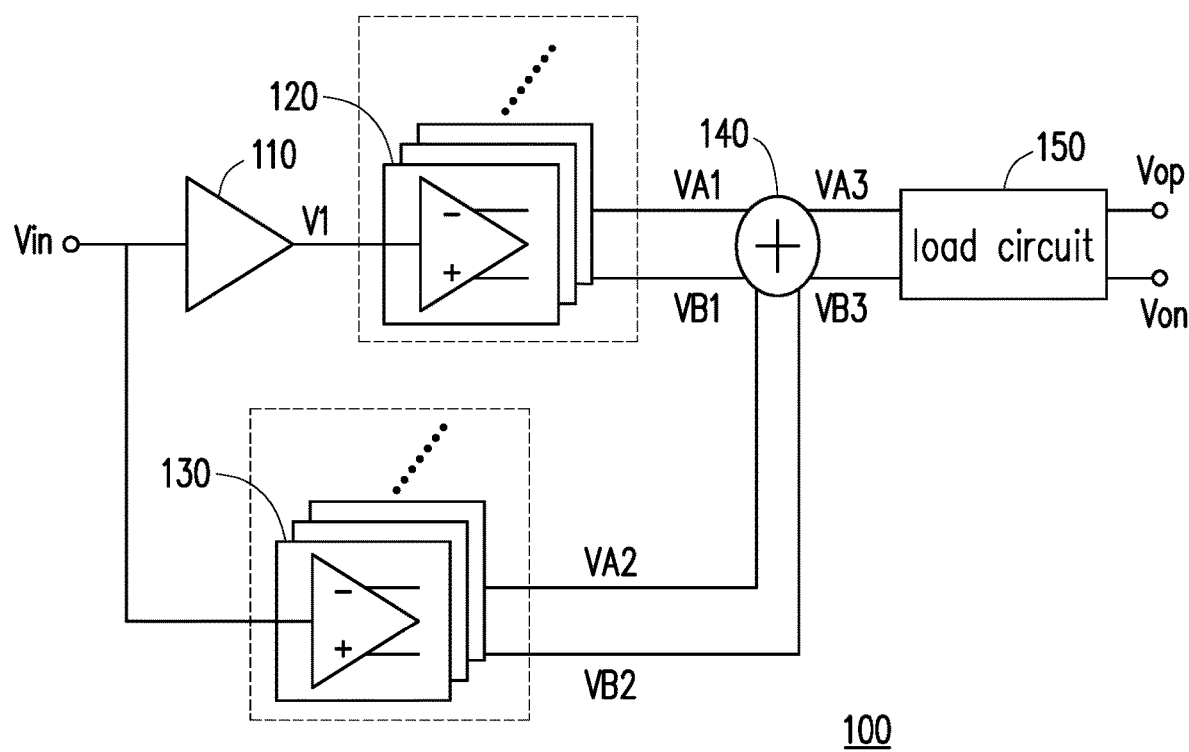
FIG. 1 is a block diagram illustrating a low noise amplifier according to an embodiment of the present application.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 is a block diagram illustrating a low noise amplifier 100 according to an embodiment of the present application. The low noise amplifier 100 includes a preamplifier 110, a first differential amplifier 120, a second differential amplifier 130, a signal adder 140, and a load circuit 150. The preamplifier 110 receives an input signal Vin and amplifies the input signal Vin to generate a first signal V1. The input signal Vin and the first signal V1 have the same phase. The number of the first differential amplifiers 120 may be plural. The first differential amplifiers 120 have a common input end to receive the first signal V1. In addition, the first differential amplifiers 120 also have a common first output end and a common second output end. The first output end and the second output end of the first differential amplifiers 120 respectively generate output signals VA1 and VB1. The output signals VA1 and VB1 form a first output differential signal pair.

The number of the second differential amplifiers 130 may be also plural. The second differential amplifiers 120 have a common input end to receive the input signal Vin. Besides, the second differential amplifiers 130 also have a common third output end and a common fourth output end. The third output end and the fourth output end of the second differential amplifiers 130 respectively generate output signals VA2 and VB2. The output signals VA2 and VB2 form a second output differential signal pair.

The signal adder 140 is coupled to the first output end and the second output end of the first differential amplifiers 120. The signal adder 140 is also coupled to the third output end and the fourth output end of the second differential amplifiers 130. The signal adder 140 receives the first output differential signal pair formed by the output signals VA1 and VB1, and receives the second output differential signal pair formed by the output signals VA2 and VB2. The signal adder 140 adds up the first output differential signal pair and the second output differential signal pair, thereby generating output signals VA3 and VB3.

The output signals VA3 and VB3 are transmitted to the load circuit 150. The load circuit 150 is coupled to the signal adder 140, and generates a third output differential signal pair formed by output signals Vop and Von according to the output signals VA3 and VB3.

In the exemplary embodiment, the noise generated by the preamplifier 110 is transferred to the input node and output node of the preamplifier 110 simultaneously. The noise on the first signal V1 and the noise on the input signal Vin have opposite phases. By using the first differential amplifiers 120, a first phase delay may be generated on the noise transferring from the first signal V1 to the first output differential signal pair VA1 and VB1. By using the second differential amplifiers 130, a second phase delay may be generated on the noise transferring from the input signal Vin to the second output differential signal pair VA2 and VB2. Under the condition that each first differential amplifier 120 and each second differential amplifier 130 have similar circuit structures, the first phase delay and the second phase delay are substantially equal. In addition, by designing or adjusting relative gain of the first differential amplifiers 120 and the second differential amplifiers 130, amplitudes of the noise on the two paths' output may also be equal, wherein one path is a path from the preamplifier 110 through the first differential amplifier 120 to the signal adder 140, the other path is a path from the second differential amplifier 130 to the signal adder 140. Thus, through the addition performed by the signal adder 140, the noise on the differential signals VA1 and VB1 and the noise on the differential signals VA2 and VB2 may cancel out each other and the output signals Vop and Von with low noise are generated by the load circuit. Therefore, the low noise amplifier cancels part of the noise in the process of signal amplification and addition, effectively reduces the noise figure and improves the signal quality.

In addition, in the embodiments of the present application, the process of single-to-differential conversion is performed by the first differential amplifiers 120 and the second differential amplifiers 130. Therefore, the low noise amplifier 100 may be refrained from using a transformer or a balun to perform single-to-differential signal conversion. Accordingly, the circuit area can be effectively reduced.

Compared with the conventional low noise amplifiers, the low noise amplifier 100 according to the embodiment of the present application is refrained from using a feedback structure and therefore is capable of increasing the working frequency bandwidth. Besides, when it is required to reduce signal gain to attain a relatively greater dynamic range, the low noise amplifier 100 is able to maintain the noise cancellation and impedance matching by adjusting the number of the first differential amplifiers 120 and the second differential amplifiers 130 that are enabled.

Figure 2:
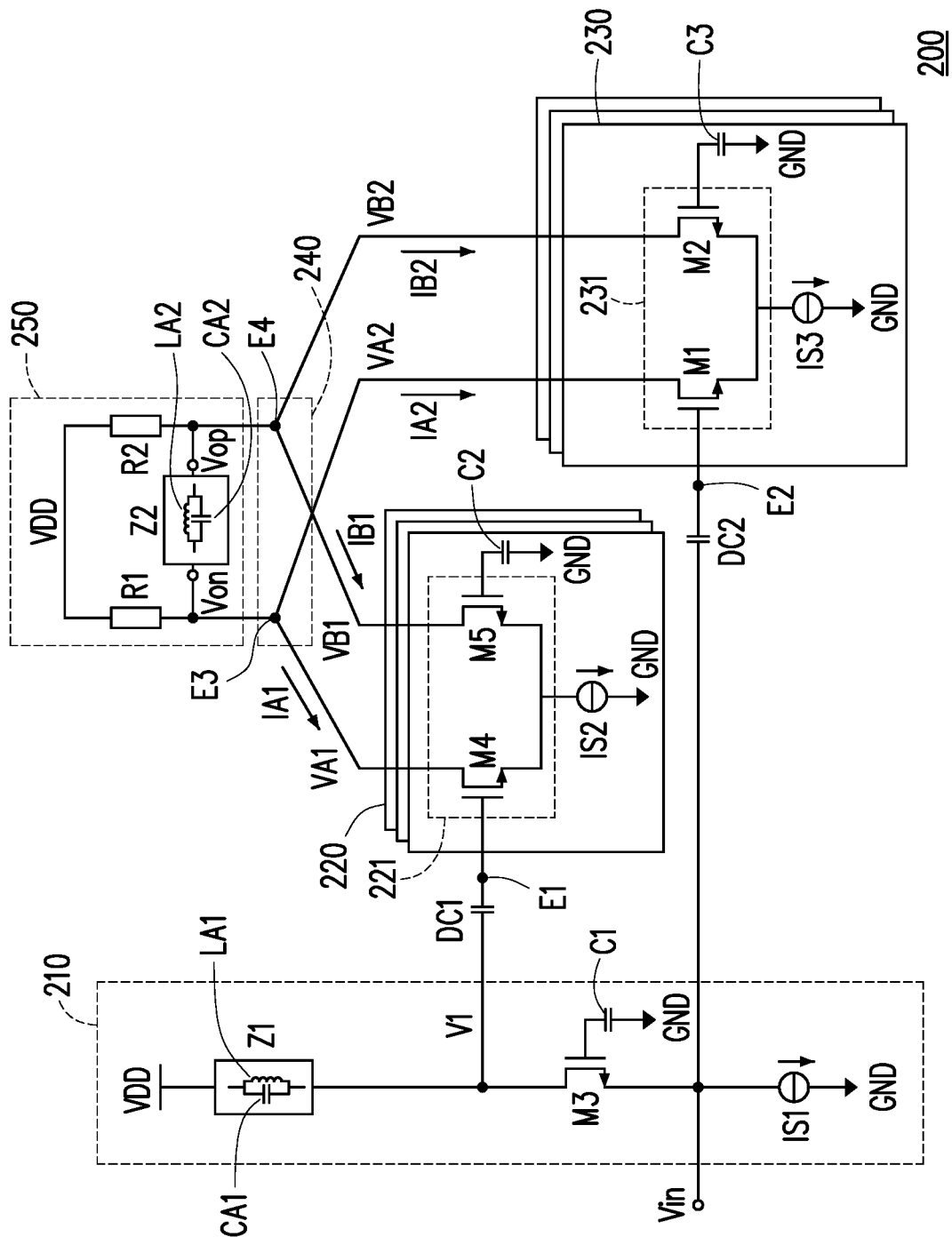
FIG. 2 is a schematic diagram illustrating a low noise amplifier according to another embodiment of the present application.

Referring to FIG. 2, FIG. 2 is a schematic diagram illustrating a low noise amplifier 200 according to another embodiment of the present application. The low noise amplifier 200 includes a preamplifier 210, a first differential amplifier 220, a second differential amplifier 230, a signal adder 240, and a load circuit 250. The preamplifier 210 is a common gate amplifier. The preamplifier 210 includes a load Z1, a transistor M3 and a current source IS1. A first end of the load Z1 is connected to a power source voltage VDD, a second end of the load Z1 is coupled to a first end of the transistor M3 and generates a first signal V1. The load Z1 is formed by an inductor LA1 and a capacitor CA1 connected in parallel. A control end (e.g., gate) of the transistor M3 is coupled to a reference voltage end GND via the capacitor C1. In the embodiment, the reference voltage end GND may be a reference ground end. A second end of the transistor M3 is coupled to a first end of the current source IS1, and receives the input signal Vin.

In addition, the current source IS1 is coupled between the second end of the transistor M3 and the reference voltage end GND.

Besides, the first differential amplifier 220 includes a differential pair 221 and a current source IS2. The differential pair 221 is formed by transistors M4 and M5. A control end (e.g., gate) of the transistor M4 is a first input end of the differential pair 221 and receives the first signal V1 via a terminal E1. A control end (e.g., gate) of the transistor M5 is a second input end of the differential pair 221 and is coupled to the reference voltage end GND via the capacitor C2. The control end of the transistor M5 receives a first reference signal. A first end of the transistor M4 is coupled to a terminal E3, and a first end of the transistor M5 is coupled to a terminal E4. The terminals E3 and E4 may respectively be a first output end and a second output end of the differential pair 221. The differential pair 221 may respectively provide an output current signal IA1 and an output current signal IB1 to the terminals E3 and E4. A second end of the transistor M4 and a second end of the transistor M5 are coupled together and serve as a common end of the differential pair 221. The current source IS2 is connected between the second ends of the transistors M4 and M5 and the reference voltage end GND and is configured to provide a reference current between the common end of the differential pair 221 and the reference voltage end GND.

The number of the first differential amplifiers 220 may be plural, and the first differential amplifiers 220 have the same circuit structure. The first differential amplifiers 220 share the terminal E1 as the input end, share the terminal E3 as the first output end, and share the terminal E4 as the second output end.

The second differential amplifier 230 includes a differential pair 231 and a current source IS3. The differential pair 231 is formed by transistors M1 and M2. In addition, a control end (e.g., gate) of the transistor M1 is a first input end of the differential pair 231 and receives the input signal Vin via a terminal E2. A control end (e.g., gate) of the transistor M2 is a second input end of the differential pair 231 and is coupled to the reference voltage end GND via a capacitor C3. The control end of the transistor M2 receives a second reference signal. A first end of the transistor M1 is coupled to the terminal E3, and a first end of the transistor M2 is coupled to the terminal E4. The terminals E3 and E4 may respectively be a first output end and a second output end of the differential pair 231. The differential pair 231 may respectively provide an output current signal IA2 and an output current signal IB2 to the terminals E3 and E4. Second ends of the transistors M1 and M2 are coupled together and serve as a common end of the differential pair 231. The current source IS3 is connected between the second ends of the transistors M1 and M2 and the reference voltage end GND and is configured to provide a reference current between the common end of the differential pair 231 and the reference voltage end GND.

The number of the second differential amplifiers 230 may be also plural, and the second differential amplifiers 230 have the same circuit structure. The second differential amplifiers 230 share the terminal E2 as the input end, share the terminal E3 as the first output end, and share the terminal E4 as the second output end. In addition, the phase delays of signal transfer caused by the first differential amplifiers 220 and the second differential amplifiers 230 are the same.

In the embodiment, the signal adder 240 is formed by the terminals E3 and E4. The output current signals IA1 and IB1 generated by the first differential amplifiers 220 and the output current signals IA2 and IB2 generated by the second differential amplifiers 230 are added up by sharing output terminals E3 and E4. The addition result generated by the signal adder 240 is provided to the load circuit 250. The load circuit 250 generates the third output differential signal pair formed by the output signals Vop and Von according to the addition result.

The load circuit 250 includes resistors R1 and R2 and an inductor-capacitor resonant tank (LC tank) Z2. The resistor R1 is coupled between the power source voltage VDD and a first output end (i.e., the terminal E3) of the signal adder 240, and the resistor R2 is coupled between the power source voltage VDD and a second output end (i.e., the terminal E4) of the signal adder 240. The LC tank Z2 is coupled between the terminal E3 and the terminal E4. By receiving the current signals provided at the terminals E3 and E4, the load circuit 250 may generate the third output differential signal pair formed by the output signals Vop and Von.

In the embodiment, the LC tank Z2 is formed by coupling an inductor LA2 and a capacitor CA2 in parallel.

In the low noise amplifier 200 of the embodiment, a DC decoupling capacitor DC1 is disposed between the preamplifier 210 and the first input ends of the differential pairs 221 of the first differential amplifiers 220 (i.e., the input end of the first differential amplifiers 220), and a DC decoupling capacitor DC2 is coupled to the first input ends of the differential pairs 231 of the second differential amplifiers 230 (i.e., the input end of the second differential amplifiers 230) and receives the input signal Vin. The DC decoupling capacitor DC1 and the DC decoupling capacitor DC2 are respectively configured to filter out the very low frequency and DC components of the first signal V1 and the input signal Vin.

Figure 3:
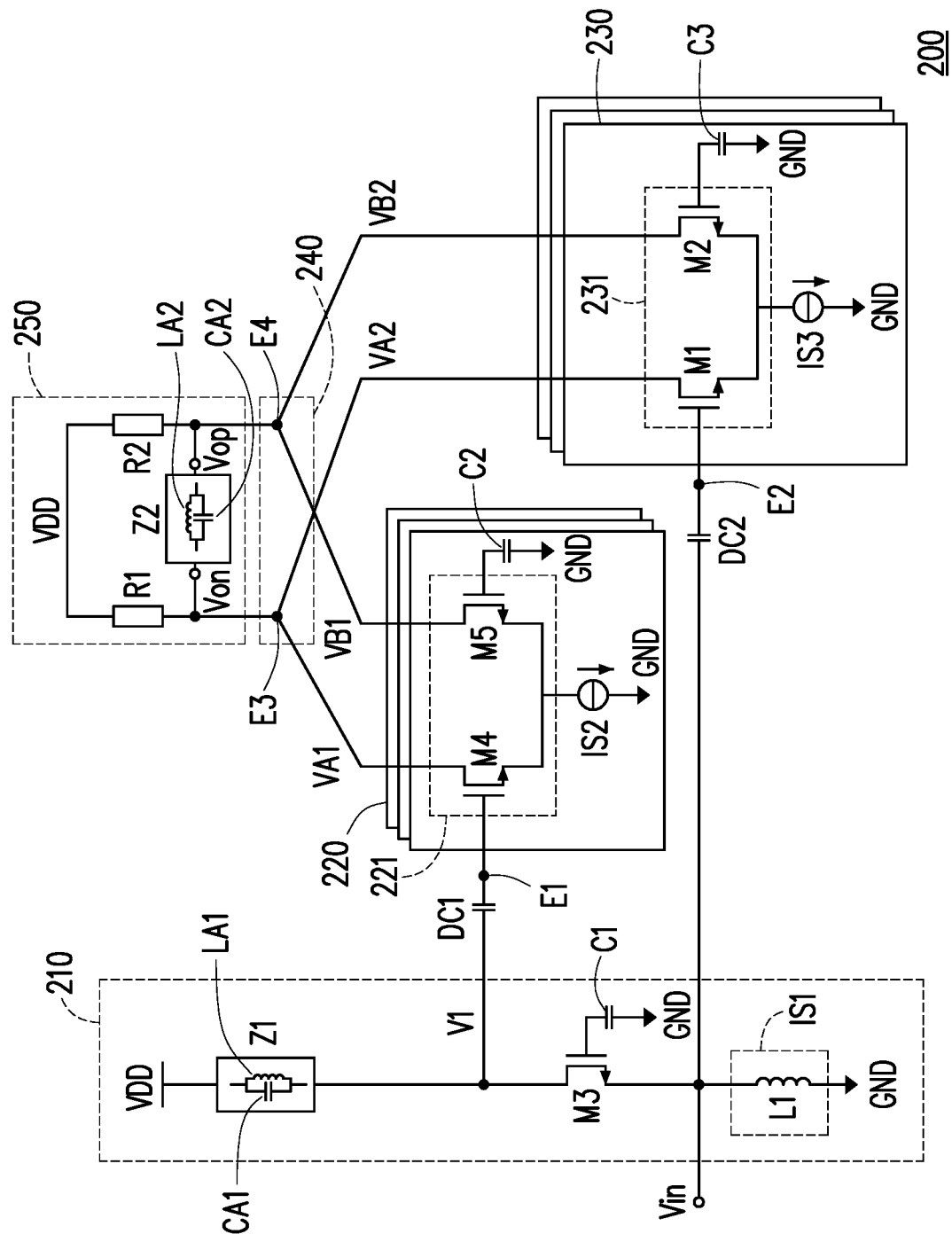
FIG. 3 is a schematic diagram illustrating a low noise amplifier according to the embodiment of FIG. 2.

Referring to FIG. 3, FIG. 3 is a schematic diagram illustrating the low noise amplifier according to the embodiment of FIG. 2. The difference from the embodiment of FIG. 2 is that, in the low noise amplifier 220 shown in FIG. 3, the current source IS1 of the preamplifier 210 is formed by an inductor L1. Alternatively, the inductor L1 may also be formed by a coil. The present application does not intend to impose a limitation on this regard.

In view of the foregoing, in the low noise amplifier according to the embodiments of the present application, the first differential amplifiers and the second differential amplifiers for two paths are disposed. With the property that the noise of the first signal and the noise of the input signal have opposite phases, the noise can be canceled by using the two amplification paths and the signal adder. In the embodiments of the present application, by avoiding using a feedback structure and avoiding disposing a transformer or a balun, the circuit area is effectively reduced, and the working frequency range of the low noise amplifier can be increased.

It will be apparent to those skilled in the art that various modifications and variations can be made to the structure of the present application without departing from the scope or spirit of the invention. In view of the foregoing, it is intended that the present invention cover modifications and variations of this invention provided they fall within the scope of the following claims and their equivalents.

What is claimed is:

1. A low noise amplifier, comprising:
   a preamplifier, receiving an input signal, and amplifying the input signal to generate a first signal, wherein the input signal and the first signal have the same phase;
   a plurality of first differential amplifiers, coupled to an output of the preamplifier, receiving the first signal and a first reference signal as a first input differential signal pair, and generating a first output differential signal pair according to the first input differential signal pair;
   a plurality of second differential amplifiers, receiving the input signal and a second reference signal as a second input differential signal pair, and generating a second output differential signal pair according to the second input differential signal pair;
   a signal adder, coupled to the first differential amplifiers and the second differential amplifiers, and configured to add up the first output differential signal pair and the second output differential signal pair to generate an addition result; and
   a load circuit, coupled to the signal adder, and generating a third output differential signal pair according to the addition result,
   wherein, a noise on the first signal and a noise on the input signal generated from a same noise source in the preamplifier have opposite phases.

2. The low noise amplifier as claimed in claim 1, wherein each of the first differential amplifiers comprises:
   a differential pair, having a first input end to receive the first signal and having a second input end to receive the first reference signal; and
   a current source, coupled between a common end of the differential pair and a reference voltage end, and providing a reference current between the common end of the differential pair and the reference voltage end,
   wherein the differential pair has a first output end configured to generate a first output signal and a second output end configured to generate a second output signal, and the first output signal and the second output signal form the first output differential signal pair.

3. The low noise amplifier as claimed in claim 2, wherein each of the first differential amplifiers further comprises:
   a capacitor, coupled between the second input end of the differential pair and the reference voltage end.

4. The low noise amplifier as claimed in claim 2, further comprising:
   a DC decoupling capacitor, coupled between the preamplifier and the first input end of the differential pair.

5. The low noise amplifier as claimed in claim 1, wherein each of the second differential amplifiers comprises:
   a differential pair, having a first input end to receive the input signal and having a second input end to receive the second reference signal; and
   a current source, coupled between a common end of the differential pair and a reference voltage end, and providing a reference current between the common end of the differential pair and the reference voltage end,
   wherein the differential pair has a first output end configured to generate a first output signal and a second output end configured to generate a second output signal, and the first output signal and the second output signal form the second output differential signal pair.

6. The low noise amplifier as claimed in claim 5, wherein each of the second differential amplifiers further comprises:
   a capacitor, coupled between the second input end of the differential pair and the reference voltage end.

7. The low noise amplifier as claimed in claim 5, further comprising:
   a DC decoupling capacitor, coupled on a path on which the differential pair receives the input signal.

8. The low noise amplifier as claimed in claim 1, wherein the preamplifier is a common gate amplifier or a noninverting amplifier which provides input impedance matching.

9. The low noise amplifier as claimed in claim 1, wherein the preamplifier comprises:
   a load, having a first end connected to a power supply;
   a transistor, having a first end coupled to a second end of the load, a control end coupled to a reference voltage end via a capacitor, and a second end receiving the input signal; and
   a current source, coupled between the second end of the transistor and the reference voltage end.

10. The low noise amplifier as claimed in claim 9, wherein the load comprises a capacitor and an inductor connected in parallel to each other.

11. The low noise amplifier as claimed in claim 9, wherein the current source is formed by an inductor or a coil.

12. The low noise amplifier as claimed in claim 1, wherein the load circuit comprises:
    a first resistor, connected between the power source voltage and a first output end of the signal adder;
    a second resistor, connected between the power source voltage and a second output end of the signal adder; and
    an inductor-capacitor resonant tank, coupled between the first output end and the second output end of the signal adder.

* * * * *